United States Patent [19]

Beigel

[11] Patent Number: 5,003,192
[45] Date of Patent: Mar. 26, 1991

[54] AC POWER SWITCHING DEVICE WITH NON-VOLATILE MEMORY UNIT

[75] Inventor: Michael L. Beigel, New York, N.Y.

[73] Assignee: Core Industries, Inc., Lynbrook, N.Y.

[21] Appl. No.: 370,604

[22] Filed: Jun. 23, 1989

[51] Int. Cl.[5] .............................................. G05F 3/04
[52] U.S. Cl. .................................. 307/140; 307/112; 323/299; 365/228
[58] Field of Search ................... 307/66, 64, 65, 112, 307/140, 135, 632, 296.4; 323/299, 300; 365/228, 154, 185

[56] References Cited

U.S. PATENT DOCUMENTS

| 4,375,601 | 3/1983 | Van Vliet | 307/592 |
| 4,541,073 | 9/1985 | Brice et al. | 365/156 |
| 4,563,592 | 1/1986 | Yuhasz et al. | 307/115 |
| 4,751,401 | 6/1988 | Beigel et al. | 307/140 |

Primary Examiner—A. D. Pellinen
Assistant Examiner—Peter Ganjoo
Attorney, Agent, or Firm—Rosen, Dainow & Jacobs

[57] ABSTRACT

A solid state semiconductor power switch for controlling the application of AC power to a load wherein the power switch employs momentary ON/OFF switches for activating the power switch, and wherein additional circuit means is provided to preserve the ON/OFF condition or state of the power switch during a power-down situation such that upon restoration of the AC power the power switch can be caused to assume the same ON or OFF state it was in just prior to the power-down situation.

21 Claims, 5 Drawing Sheets 5,003,192

AC POWER SWITCHING DEVICE WITH NON-VOLATILE MEMORY UNIT

REFERENCE TO RELATED CASE

This application is related to my earlier filed U.S. patent application, Ser. No. 28,959, filed Mar. 23, 1987, now U.S. Pat. No. 4,751,401.

FIELD OF THE INVENTION

This invention relates to an alternating current (AC) power switching device, and in particular to a solid state switch employing an isolating method to separate the control circuit activated by the user from a semiconductor power switch, such as a triac, which supplies power to a load.

BACKGROUND OF THE INVENTION

My above-identified patent describes a preferred form of such a switching device in which the control circuit employs a flip-flop (FF) circuit which functions as a bistable latch for controlling the ON/OFF states of a light-emitting diode (LED). The latter, in turn, activates a photo-sensitive device whose conduction state tracks that of the LED. The photo-sensitive device is connected in series with the gate of a triac, whose ON/OFF state in turn depends upon the current drive to its gate. When the triac is ON, the load is connected through the triac across the AC power line. The related patent also describes a novel enclosure for the switch which allows in one embodiment mounting of the switch in a wall junction box and provides a suitable heat transfer path for the triac which carries the full load current.

The present invention is directed to an improvement in the control circuit for the solid state switch to widen its range of possible applications. This will be best understood from a brief recapitulation of one of the circuits disclosed in the patent, which is illustrated in FIG. 1 in schematic, block form, reference being had to the patent for a more detailed description of that circuit.

The circuit of FIG. 1 comprises an AC line voltage source 10 connected to the primary of a step-down transformer 11 whose secondary is connected to a filtered rectifier shown schematically as a capacitor 12 and diode 13 for producing an unregulated direct current (DC) supply voltage labelled V+ for operating the solid state components of the control circuit. The AC line 10 is also connected to a load 14 via the cathode/anode circuit of a triac 15. The triac gate 16 is in series with a current limiting resistor 17 and a photo-sensitive device 18 shown as a diac. The latter is optically coupled to an LED 19. Usually, the LED 19 and photo-sensitive device 18 are packaged and sold together as a single component. When current equal to, for example, 5 mA is sourced to the LED 19, it outputs radiation 20 which turns on device 18 causing a current flow into the triac gate 16 which turns on the triac allowing current from the AC line to flow to the load 14.

The control circuit of FIG. 1 comprises an SR FF 22. The S and R inputs of the FF 22 are buffered by special circuitry to allow the switch to be compatible with an earlier electromechanical version. The buffer circuits 23, 24 are respectively connected to the S and R inputs of the FF 22 and momentary ON 25 and OFF 26 switches. As explained in my related patent, the buffers 23, 24 allow an AC signal voltage to be present at the ON 25 or OFF 26 switches without toggling the SR FF 22 to either of its states, in one of which the LED 19 is activated and in the other of which the LED remains OFF. Only when either switch 25, 26 is closed (and connected to ground potential) for a predetermined interval of time will the buffers 23, 24 allow the "ground" signal to pass through to the R and S inputs of the FF 22 and allow it to change state. So long as AC power is applied, the bistable FF retains the state of the switch determined by which of the ON, OFF switches 25, 26 was last activated.

There are applications in which it is important that the AC power switch retain or remember its current state in the event of loss of the AC line voltage, due, for example, to a temporary blackout or power loss or outage situation. When power is restored, it may be necessary or desirable that the load is restored to the state it was in when power was lost, i.e. powered ON or remain OFF, without it being necessary to re-activate one of the momentary switches 25,26.

U.S. Pat. No. 4,563,592 describes a wall box dimmer switch employing a latching relay, an electro-mechanical device, to preserve the on-off status of the switch if the AC supply fails. In FIG. 3a, an electronic latch using a flip-flop circuit is illustrated. No explanation is given as to how a standard FF component can preserve its state upon power loss. The state that a standard FF will come up in on power being applied is unpredictable, as distinguished from a latching relay which could use special means, such as magnets, to hold contacts closed on power loss.

The use of an electro-mechanical relay may not have the extended lifetime possessed by solid state components. It will be noted that the device is intended to be housed in an electrical junction box, and would be expected to operate without problems for 20-30 years. Electro-mechanical components could not normally be relied on to perform flawlessly for that long period of time. Addition of a back-up battery to maintain a standard FF in a given state will not solve the problem, since batteries, even if continually re-charged, cannot be expected to provide 20-30 years of life. A large capacitor that stores charge can be used temporarily to preserve operating voltage for FF components, but their ability to maintain voltage is limited, especially if current continues to flow in the circuit, gradually dissipating the stored charge. However, one would want a large capacitor for maximum protection, but large capacitors are usually of large size, making it difficult to fit them within the usual electrical junction box. The same problem occurs with an electro-mechanical relay, which may be of a size making it difficult or impossible to fit into a junction box. Moreover, high temperature operating conditions that may occur in an enclosed junction box reduce the life of batteries and capacitors.

BRIEF DESCRIPTION OF THE INVENTION

An object of the invention is an AC power switch which retains its last state upon a loss of the AC line voltage.

Another object of the invention is an AC power switch employing a bistable element for retaining the state of the switch and which does not lose memory of its state upon loss of power.

Still a further object of the invention is a solid state AC power switch activated by a momentary ON-OFF switch and capable of retaining the power switch state not only while power is available but also while power is lost or unavailable.

Still another object of the invention is a solid state AC power switch that is compact and capable of being fitted to a standard electrical junction box.

A further object of the invention is a solid state AC power switch that can retain its power switch state, and that is capable of an extended lifetime of many years of use.

These and other objects and advantages of the invention are achieved, briefly speaking, by connecting non-volatile memory means to the FF to prevent the loss of state memory during blackouts or power failure.

One aspect of the invention is to provide circuitry to detect a power-down condition, read the current state of the power switch, preserve (or maintain) the current state just read, and restore the current state upon a power-up condition.

In accordance with another aspect of the invention, upon the power-down condition, the current state of the power switch is sensed and compared to that of a bistable memory element used to preserve the current state. The state of the latter is changed only if it differs from that of the power switch current state. This feature may help extend the lifetime of certain non-volatile memory elements having limited endurance, i.e., the number of cycles of reliable useful life.

One of the advantages of the invention is that the control circuitry required can be readily fitted into a single IC chip, with the exception of the power supply for powering the circuitry. This is important not only to reduce costs, but also in those instances where the power switch has to be packaged such that it will fit within a wall junction box or in other similar applications where small size is important.

BRIEF DESCRIPTION OF DRAWINGS

There now follows a detailed description of several preferred embodiments of the invention, which should be taken together with the accompanying drawings wherein.

DETAILED DESCRIPTION OF PREFERRED EMBODIMENTS

Figure 1:
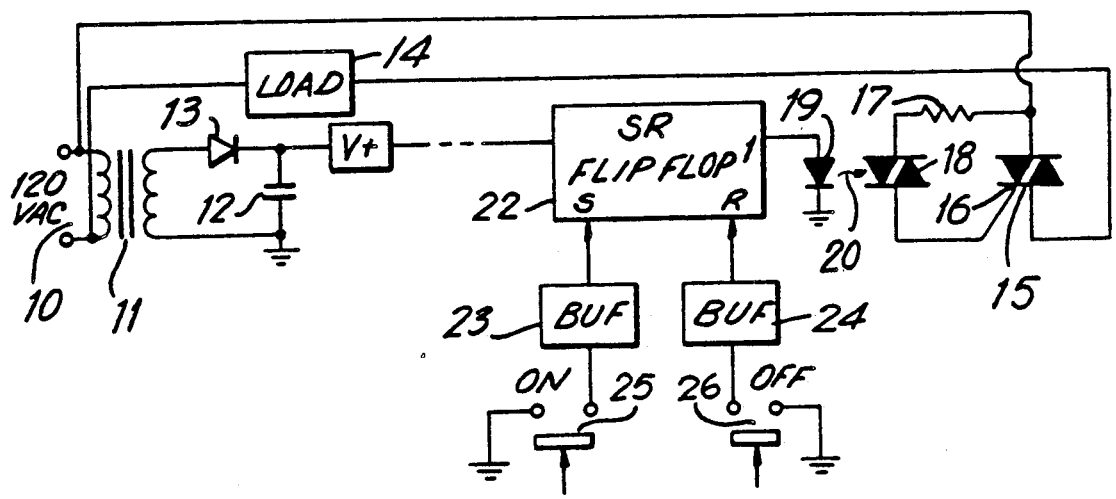
FIG. 1 is a schematic, block diagram of the circuitry described and claimed in the prior referenced patent No. 4,751,401.
Figure 2:
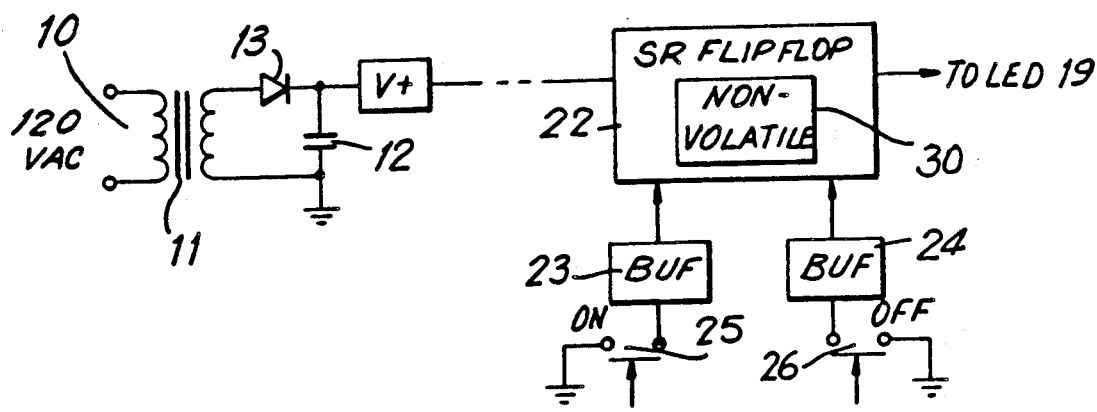
FIG. 2 is a block diagram of the control circuit of one form of power switch in accordance with the present invention.

FIG. 2 illustrates, broadly, the concept underlying the present invention. The same reference numerals are used as in FIG. 1 to designate the same elements. This is true also for the other figures in the drawings.

The difference in the FIG. 2 embodiment from what is shown in FIG. 1 is the presence of the non-volatile memory 30. The non-volatile memory 30 preserves (or maintains) the state of the FF 22 so that when power is lost and restored, the AC power switch assumes the same state it was in prior to power interruption.

Figure 3:
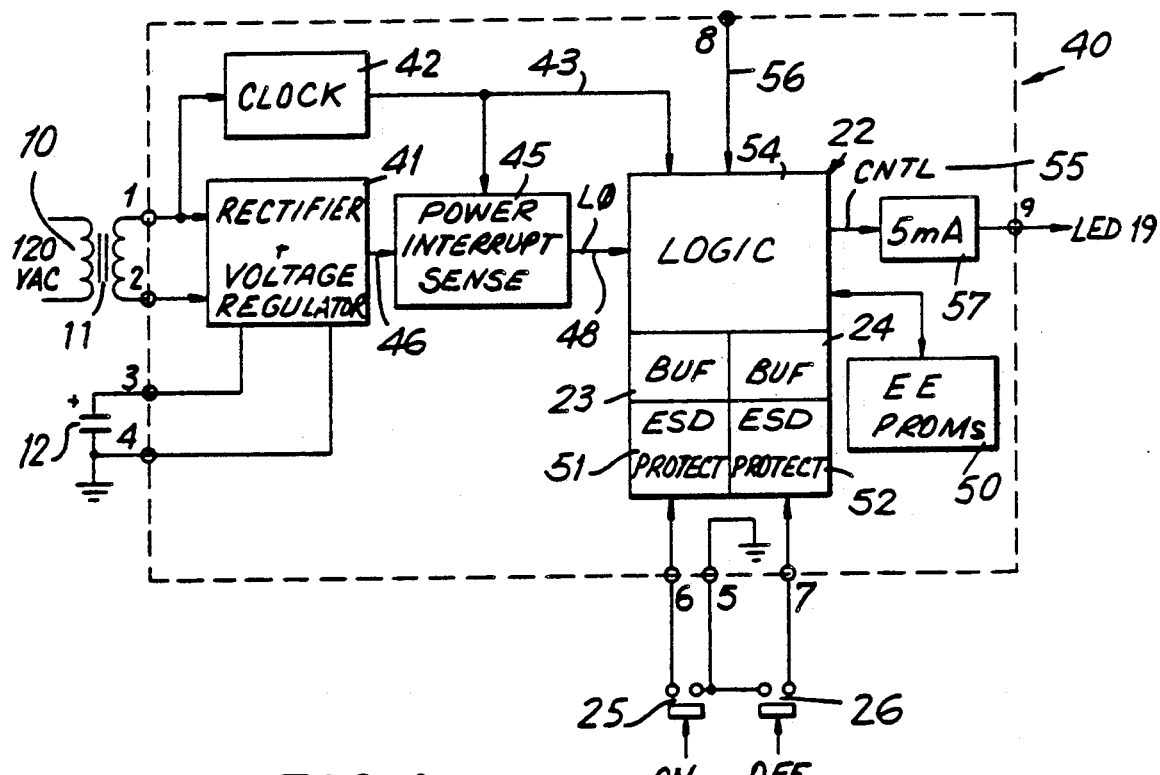
FIG. 3 is a more detailed block diagram of the embodiment shown in FIG. 2.

FIG. 3 shows a more detailed version in accordance with this embodiment of the invention. In a typical circuit, the step-down transformer 11 converts the AC line voltage to about 6.3–9.0 VAC for activating the control circuit in accordance with the invention, designated 40 in FIG. 3. The components within the rectangle are mounted on a single circuit board, or preferably built into a single IC chip, and the external components are shown connected to terminals on the circuit board or chip. These external components include the step-down transformer 11, power supply filter capacitor 12, the momentary ON/OFF switches 25, 26, and the connections to the LED 19.

The power supply for the control circuit is provided by an on-chip rectifier system 41 which may be a single diode or preferably a diode bridge, which charges the external storage capacitor 12 to provide the unregulated DC power supply in the system. If desired, a voltage regulator circuit or chip may be included to stabilize the operating parameters of the system.

A clock circuit 42 is provided for generating a clock signal of, for example, 60 Hz, derived from the 60 Hz AC line voltage. The clock signal generated on line 43 serves multiple functions, such as timing for the input switch buffers 23,24 and power interrupt sensing.

The power interrupt sensor or power-down detector 45 must reliably sense loss of the AC power at the input 10 to the transformer 11. There are several ways in which this can be accomplished within the spirit of my invention. For example, one way is to sense a reduction in the unregulated supply voltage at, for example, node 46. Another way is to sense interruption of the clock signal at node 43 for a specified time interval. In the latter case, the simplest way to achieve this result is to provide an internal timer circuit which is reset by one or more clock cycles. If no resetting signal is received, it is assumed that the failure of the clock signal to appear is due to a power outage, and an output signal appears on line 48. This output signal generated by the power interrupt sense circuit 45 is used to disable power output to the LED to conserve operating power within the control circuit, and to write the state of the RS FF 22 into an electrically erasable programmable read-only memory (EEPROM) 50 which is a non-volatile memory element and serves to preserve the current state (ON/OFF) of the AC power switch.

It is advantageous to provide additional circuit elements in order to assure reliable operation in certain applications of the invention. For example, the input lines from the external ON/OFF switches 25, 26 are susceptible to electrostatic discharge (ESD) transients transmitted by contact or induction, since it is desirable in the overall system that the ON/OFF momentary switches 25, 26 be remotely connected to the control circuit 40 and from that remote location be exposed and available for finger activation. This is especially important because the AC power switch of the invention is designed for permanent installation and useful life of over 20 years. The ESD protection circuitry is shown at 51 and 52 in FIG. 3.

In connection with the buffers 23, 24, the input to the buffers provided by the momentary switches 25, 26 is deemed to be activated when it is grounded for a period of, for example, greater than, approximately, 50 ms. This can be readily achieved by including in each buffer a timer circuit which is activated when ground potential is sensed, and starts timing so long as ground potential is maintained. If, for example, after 50 ms, ground potential has continuously been sensed, then an activation signal is outputted to the logic circuit 54.

One method of obtaining the timing function associated with the buffers 23, 24 is to provide a counter clocked by the clock output 43 and reset whenever a ground signal is not sensed. This is the equivalent of a polling technique, well known, as such, in the computer arts. If the counter is not reset by the ground signal, then when it reaches the desired clock output, an activation signal is generated for activating the logic section 54 of the circuit according to the invention.

The logic section 54 determines the state of a current source 57 output to the LED 19 and the management of the EEPROM section 50, dependent upon the inputs from the ON/OFF buffer stages 23, 24, the clock 42, and power interrupt sense 45. The operation of the logic section 54 is as follows:

(1) Power-up Sequence: upon first receiving POWER interrupt sense signal (LO) and CLOCK signals, read the EEPROM 50 and set the CNTL 55 of the output to the LED to the logic level indicated by the contents of the EEPROM 50.

(2) Normal Operation: Each time a signal from the ON or OFF buffers is received, set the CNTL output 55 to "1" for ON, and to "0" for OFF. Maintain the state of the CNTL output 55 in the absence of signals from the ON or OFF buffers.

(3) Power Interrupt: Upon receiving the sense signal LO from the power interrupt sense circuit 45, read the contents of the EEPROM 50. If the EEPROM state equals the state of the CNTL output 55, do nothing. If the EEPROM state does not equal the state of the CNTL 55 output, write the state of the CNTL output 55 into the EEPROM 50. Thus, the logic section 54 compares the EEPROM 50 state to the state at the CNTL output.

Whenever the CNTL state at the logic output 55 equals a binary "1," and in the absence of a Power Interrupt condition, the circuit designated 57 provides a constant current source output to the LED 19 to cause it to emit sufficient radiation to activate the photosensor 18 and thus turn the TRIAC on.

A further advantage of the invention is a control circuit which is very flexible and capable of serving many applications. For example, additional functions can be provided in the circuit of the invention with very few changes. The logic input or inputs shown at 56 also can be used to implement some of the functions described. For instance, a circuit can be provided to automatically activate the FF 22 into a particular state (ON or OFF) in the event of a power-on set (S) or reset (R) signal. This does not completely address the basic problem because the setting of the FF will always be the same regardless of the previous state just before power loss, but in some applications this functioning may be desirable. Another possibility is to hardwire the ON/OFF temporary switches such that each momentary closure also automatically sets the EEPROM to the same state. A further possibility is to toggle the inputs to the circuit. The dashed rectangle in FIG. 3 symbolizes a packaged circuit, with the small circles on the rectangle numbered 1–9 representing the package pins or like contacts to the outside world.

Figure 4:
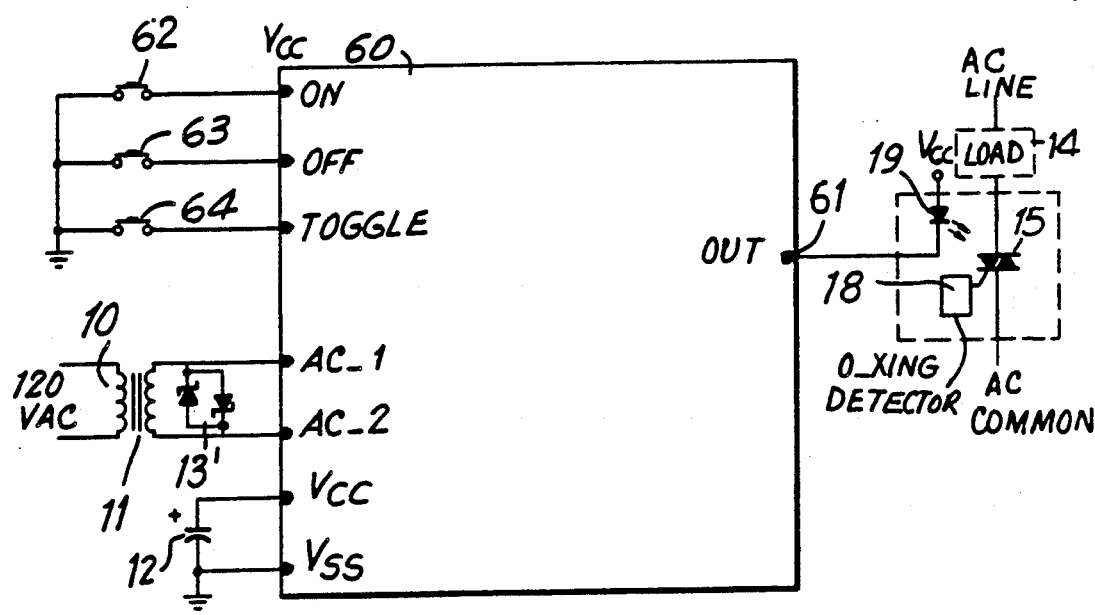
FIG. 4 is a block diagram of another embodiment of the invention employing a control circuit incorporated in an IC chip.
Figure 5:
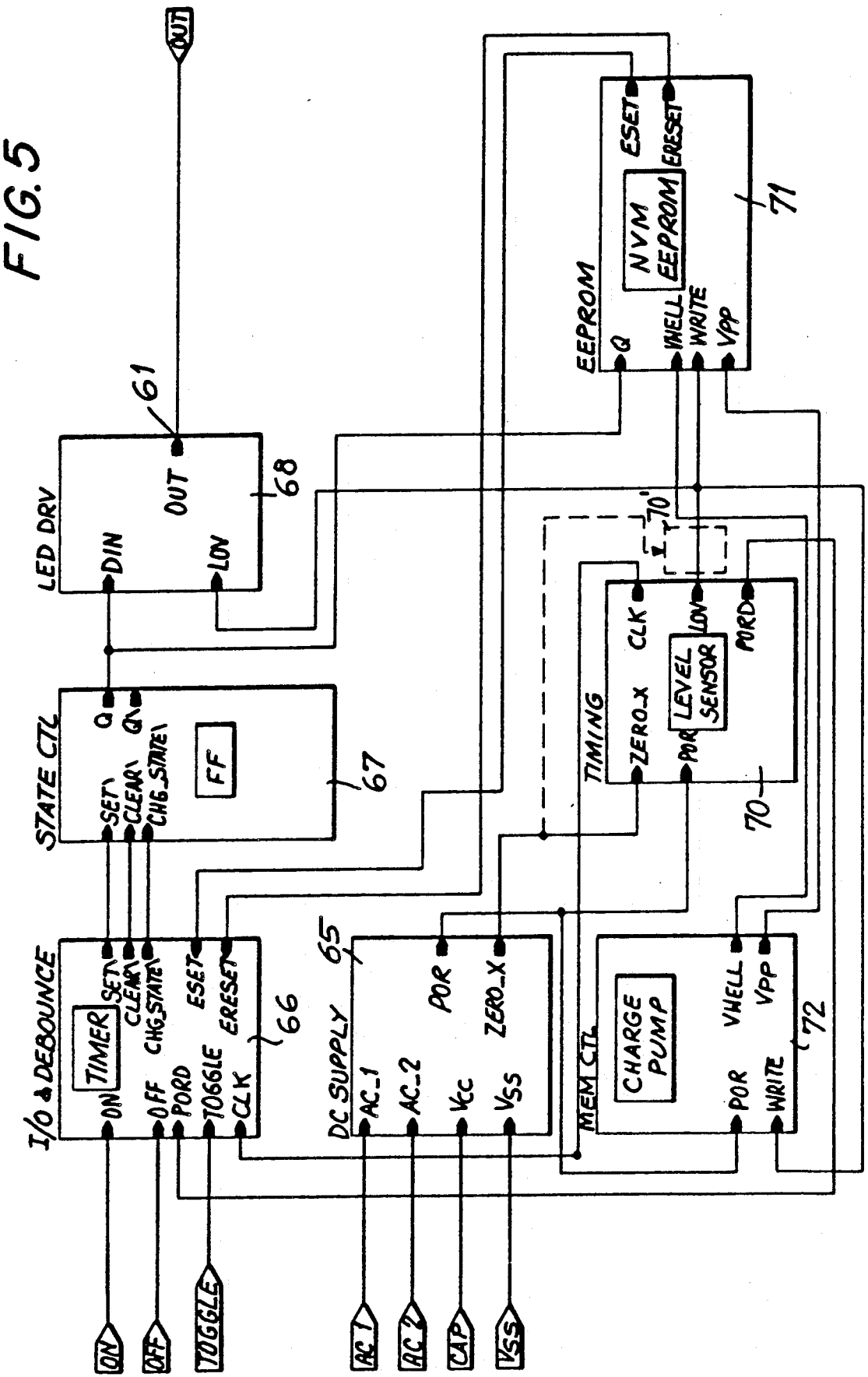
FIG. 5 is a more detailed block diagram of the IC circuitry of the embodiment of FIG. 4.

FIGS. 4 and 5 illustrate another embodiment of the invention, in this case specifically implemented as a one-chip IC and with additional features.

In FIG. 4, the IC is represented by block 60 with an output terminal 61 connected to the LED 19, which interacts with a photo-sensitive detector 18' in the gate circuit of the triac 15. Rectified and filtered low voltage (Vcc is the supply voltage and Vss is the reference or ground potential—this notation is typical for CMOS circuitry) is supplied by step-down and isolation transformer 11. A bridge rectifier is shown at 13', and the power supply filter capacitor at 12. Three user-operated switches 62,63,64 are shown here, with switch 62 activated to turn the control element ON, 63 to turn it OFF, and 64 to toggle it. FIG. 5 is a block diagram of the circuitry inside the chip 60. The input terminals on the left and the output terminals on the right are labelled as in FIG. 4.

In this implementation, the block 60 is a CMOS integrated circuit that controls the switching of AC power to some AC operated device represented by the load 14. By the closing of any one of three switches 62, 63, 64 to the input to the device, one can select the ON state of the AC operated device, the OFF state of that device, or by closing the TOGGLE switch input, the state of the device can be switched to the opposing state. For example, if the AC device were ON, and the TOGGLE input were activated, then the state of the AC device would be changed to OFF, and, conversely, an OFF state device will be switched ON by activation of the TOGGLE input. In addition to the controlling of the states of an AC operated device, the single chip contains all the necessary circuitry to perform full wave or other desired form of rectification of the AC power signal, and with the addition of an external filter capacitor, the DC power necessary to power the device is derived from this section.

A feature of the device is its ability to detect a low AC power condition, and to save the present state of the AC device or its control to a self-contained EEPROM, thus providing non-volatile storage of the present state of the AC device. In the event of total power failure, the state of the AC device is remembered, and upon restoration of AC power, the state of the AC device is restored to its same state as before the power outage.

There are seen major functional blocks associated with the chip, as shown in the block diagram of FIG. 5. The DC SUPPLY block 65 is connected to the AC line via the step-down transformer which supplies approximately 10 volts rms at 50 or 60 Hz, the AC line frequency, to the AC 1 and AC 2 inputs of the DC SUPPLY. Internally, the AC voltage is optionally full wave rectified, and the resultant rectified voltage is connected to the signal called CAP. Externally, a capacitor 12 of approximately 47 uF is connected between CAP and VSS, which is typically ground. This provides the necessary filtering of the rectified AC signal to supply a DC voltage Vcc to power the device. In addition to rectification, the DC SUPPLY block contains known signal conditioning and zero-crossing detection circuitry to provide a 60 Hz (or 50 Hz) clock signal at the ZERO_X output for some basic timing functions. This block also contains a conventional voltage level sensing circuit which monitors Vcc on start-up or on reset and outputs a Power_On_Reset (POR) signal when Vcc is greater than or equal to a threshold voltage or upper trip point, for example, 6 volts.

The I/O & DEBOUNCE block 66 interfaces to the three switch inputs, ON, OFF, and TOGGLE. These switch inputs have (as do all the inputs) input protection devices to protect against static discharge damage. In addition, internal signals, ESET for ON and ERESET for OFF, from the EEPROM and power on reset circuitry (PORD) cause the state of the EEPROM to be written to a state controller 67, which places the AC device in the same state as it was before power failure. The function of the I/O & DEBOUNCE block 66 is as follows.

In the normal state with power on, all three switch inputs are "open," and the AC load controlled by the device is either ON or OFF. We assume it is OFF. If the OFF switch 63 is depressed (OFF connected to ground), no action will occur. If either the ON switch 62 or the TOGGLE switch 64 is depressed, a conventional timer in the I/O & DEBOUNCE block 66 will start, and if the ON or TOGGLE switch is held down long enough (approximately 50 mS or 3 cycles of the AC line), the state of the AC load will be changed from OFF to ON. If the switch 62 or 64 is released before the 50 mS timeout occurs or if an AC signal were present as in the case of the device being connected in parallel with the control lines of the prior art device, no action will take place, and the device will remain OFF. If the device were turned ON instead, then depression of the OFF 63 or TOGGLE switch 64 and maintaining the depression for 50 mS will cause the device to again switch to the OFF state. After power loss has occurred, during the "power on" sequence, data is written to the state controller 67 from the EEPROM block 71, and no debounce cycle is required for this operation. The ON-OFF state of the system is controlled by signals that are conditioned as they pass through this block. The system state can be set or reset either by a signal from the switches 62, 63, 64, or by signals from the EEPROM (ESET, ERESET). Either set of signals are conditioned in a similar manner in this block and outputted as shown directly to the STATE_CTL block 67. As seen by the latter, its SET/CLEAR/CHG_STATE signals are the same irrespective whether they originated at the switches or at the EEPROM block.

The STATE CTL block 67 consists merely of a known RST flip-flop which can be set, reset or toggled, depending upon the signal from the I/O & DEBOUNCE block 66. The Q output of the STATE CTL block 67 is connected to the LED_DRV block 68 which is used to supply drive current and to control the external LED 19 of an optoisolator. If the AC load is to be ON, then the output 61 is LOW. Conversely, if the AC load is to be OFF, then the output 61 is HIGH, i.e., in a high impedance state. During a power failure, when a predetermined low voltage condition of Vcc occurs, the AC load is immediately shut off to conserve power, i.e., the charge on the filter capacitor 72, for writing to the EEPROM. This is accomplished by the signal LOV which is connected to the LED_DRV block 68 and drives the output 61 HIGH.

The TIMING block shown at 70 provides the 50/60 Hz clock signal for the debounce circuitry, and contains a conventional voltage level sensing circuit having an upper trip point, about 70% of normal operating voltage—about 6 volts when Vcc is about 9 volts—, and a lower trip point about 60 % of normal operating voltage—about 5 volts when Vcc is about 9 volts. This level sensor, in a known manner, outputs low voltage detection, LOV, and power on reset, PORD, signals which are sent from this block. PORD is a signal that tracks the DC supply voltage Vcc up to a preset value of about 6 volts, the upper trip point. This output which is sent to the I/O & DEBOUNCE block is used to reset the circuitry to a known state, and to load the state of the EEPROM into the STATE_CTL 67. In the event of a power failure, the condition manifests itself as a deteriorating DC voltage level. When the level of Vcc diminishes to about 5 volts, the lower trip point, a signal, LOV, is generated. This signal is sent to the LED_DRV block and serves to turn off the control or load device, and is sent to the EEPROM block to cause the state of the STATE_CTL output Q to be written to the EEPROM block 71 when the proper write voltage has been achieved, initiated by also sending the LOV signal to the MEM_CTL block 72.

The MEM_CTL block 72 consists of a free running oscillator, a well charge pump, and EEPROM well control logic. The oscillator, which can be continually running at approximately 500 kHz, or preferably only triggered or activated on power loss by the LOV signal, is used to switch an array of capacitors that, in turn, are sequentially switched to generate the high voltage needed by the EEPROM to write. This is the well charge pump, which is a known circuit. The high voltage generated by the well charge pump is connected to the EEPROM only when a low voltage condition is sensed and the LOV/WRITE signal is generated. The EEPROM block 71 contains two EEPROM bits. During a power outage, the state of STATE_CTL 67 is differentially written to both bits. Logic required to perform this known write function is contained within this block.

There are several important features associated with this embodiment. As mentioned earlier, long lifetime is important in many applications. The component most likely to fail is the EEPROM, not only because higher voltages than Vcc are typically required to store information in it, but also because EEPROMS have limited endurance. That is, the EEPROM can switch states just so many times before the difference between its 1 and 0 states becomes unreliable. This has been attacked in two ways. First, though only one-bit of storage is required, two EEPROMS are provided to store that one bit in a differential manner. While this circuit, as such, is known, it has not been used to my knowledge in the present environment. In differential EEPROM storage, whenever a 1 is stored in one EEPROM, a 0 is stored in the other, and the output is determined by the stored voltage difference between the two EEPROM voltage states. Thus smaller voltage differences can be more reliably determined.

One way of reducing EEPROM switching is to avoid switching the EEPROM if only a temporary reduction or drop-out in the AC voltage occurs. This temporary reduction or drop-out may occur due to a temporary drop in line voltage or to fluctuations in voltage caused by the input switches 62, 63 and 64. This is achieved by waiting, as indicated above, for a specified period of time before activating the remaining circuitry. This can be accomplished by including an additional timer connected to the LOV output of the level sensor block 70, shown in dashed lines at 70', with a period slightly longer than the line voltage frequency, which would be reset by the clock derived from the AC line voltage at the ZERO_X output. If the voltage level is restored within that period of time, there will be no output to the WRITE input of the EEPROM and the state stored in the STATE_CTL block remain unchanged. Should the low voltage condition continue for more than the specified period, then the LOV output from block 70 starts a sequence of events that include shutting off the LED, and starting the oscillator in the MEM_CTL block 72. It will be appreciated that when the AC external voltage falls off, the filter capacitor 12 gradually loses voltage. This voltage, Vcc, will fall faster if the LED, which is consuming current, is ON. Moreover, again to preserve component life, it is preferred that the oscillator which is part of the charge pump in block 72 does not run continuously. Hence, the oscillator is not started until it is clear that a real voltage drop has occurred, rather than a temporary reduction or drop-out. These circuits are constructed so that within the time interval of about another three AC cycles, the oscillator will have charged up the charge pump to the value needed to write to the EEPROM. This will occur sufficiently quickly to ensure that the capacitor 12 will still retain sufficient charge to operate the EEPROM block 71.

Figure 6:
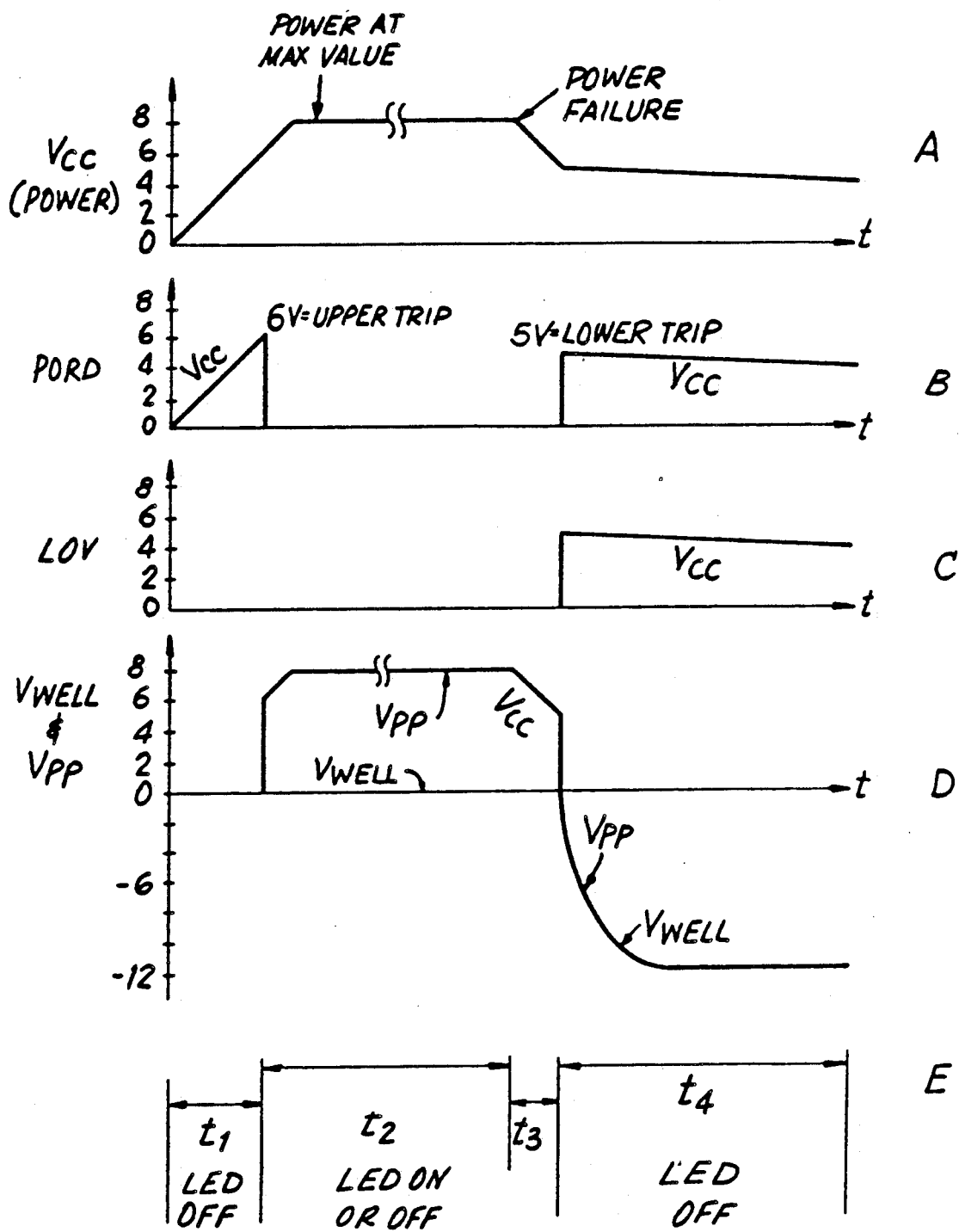
FIG. 6 is a series of waveforms depicting operation of the embodiment of FIGS. 4 and 5.

This sequence of events will be made clearer by reference to FIG. 6, which shows a series of waveforms taken at different points of the circuit of the embodiment of FIGS. 4 and 5 as a function of time along the abscissa. In FIG. 6A, $V_{cc}$ is plotted during reset, during normal operation, and during a power failure. FIG. 6B shows PORD, outputted by the TIMING block 70; FIG. 6C shows LOV outputted by the same block; FIG. 6D shows the outputs $V_{pp}$ and $V_{well}$ from the MEM_CTC block 72; and FIG. 6E shows the condition of the LED; all shown for the reset, normal and failing modes depicted in FIG. 6A. As indicated in FIG. 6B, as Vcc rises during start-up, PORD follows the rising voltage until its upper trip point is reached, when its output falls to zero. During this period, $t_1$, the LED is off but the contents of the EEPROM have been read via the I/O & DEBOUNCE block into the STATE_CTL block and sets or resets the FF which is latched at the end of $t_1$. This action restores the state of the switch and determines whether the load is driven during the normal cycle during time $t_2$. Meanwhile the circuitry in the MEM_CTL block 72 generates a voltage $V_{pp}$ which in the EEPROM block corresponds to $V_{ss}$ used in the other blocks. That is, it is the negative supply for the EEPROM. However, during time $t_2$, $V_{pp}$ is clamped to $V_{cc}$. The EEPROM cannot be written to when its negative supply $V_{pp}$ is equal to its positive supply $V_{cc}$. Since the oscillator is off, $V_{well}$ is held at 0 volts. During this time interval $t_2$, the state of the FF in the STATE_CTL block can be changed by the switches 62, 63, 64, i.e., external inputs, but the EEPROM is not in any way involved.

At the end of $t_2$, power fails. During a period $t_3$, $V_{cc}$ falls, due to discharge of the filter capacitor, until the level sensor in block 70 reaches its lower trip point. At that point in time, the beginning of $t_4$, PORD goes high and causes LOV to go high. This triggers the WRITE input in block 72 which enables the oscillator and well pump. As will be observed in FIG. 6D, $V_{pp}$ reverses polarity and is driven negative to its normal value while simultaneously $V_{well}$ increases negatively. When $V_{pp}$ becomes negative enough (about 10-12 volts), the contents of the FF in block 67 available at its Q output is written into and stored in the EEPROM. The conditions necessary for storage are $V_{pp}$ sufficiently present after a short interval in time period $t_4$ and while $V_{cc}$ remains sufficiently high to allow the circuits to operate to carry out these functions. The writing of the EEPROM continues until $V_{cc}$ becomes too low for the oscillator and charge pump to function.

Figure 7:
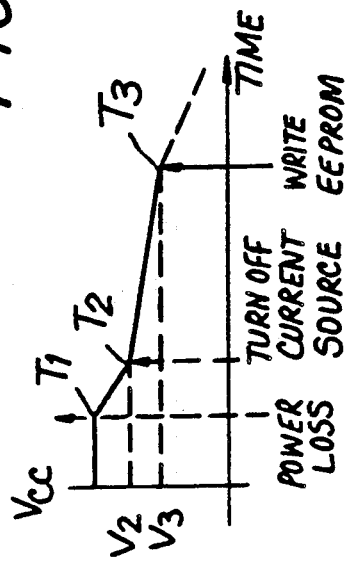
FIG. 7 and 8 are graphs depicting, respectively, operation of a one-threshold system of the type shown in FIGS. 4 and 5, and of a two-threshold modification of the system of the invention.

In the system described in this embodiment, a timer is used only to avoid activation by temporary glitches. When the three cycle interval (not shown in FIG. 6) has lapsed, then a level sensing circuit is activated which monitors Vcc. When the voltage drops to about 4.5-5 volts, then, only, is the EEPROM driven. This therefore allows a reasonably long wait time (for the voltage to rise if only a temporary glitch were present) before cycling the EEPROM. This can also be illustrated by the waveform depicted in FIG. 7. Voltage, Vcc, is plotted against time along the abscissa. Assume at $T_1$ power loss is sensed (this is after the three-cycle wait period). The level sensor triggers when the voltage drops to $V_2$ at time $T_2$, at which time the LED is shut down, and the write signal for the EEPROM is generated. If the oscillator in the charge pump were continuously running, the EEPROM is written to immediately. Otherwise, the EEPROM is written to a short time after $T_2$ as soon as $V_{pp}$ becomes negative enough. This may be referred to as a one-threshold system.

Figure 8:
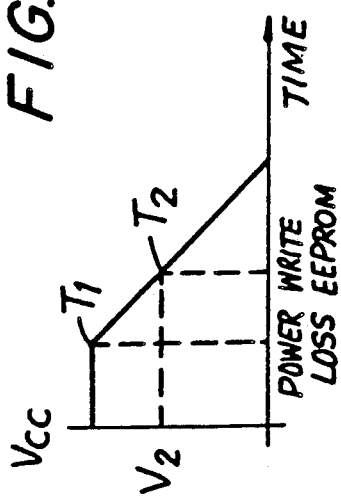

Another embodiment is represented by the waveform in FIG. 8, which employs a different approach employing two thresholds. As before, power loss is sensed at time $T_1$. Vcc is monitored. When a first threshold value $V_2$ is achieved at time $T_2$, the LED current source is turned off to preserve capacitor charge. At time $T_3$, when the voltage has dropped to $V_3$, the EEPROM write signal is generated. While an embodiment based on this principle would allow even a longer delay in cycling the EEPROM, it has the disadvantage that additional circuitry is required, which is more difficult to achieve in a single chip IC built with the current technology. Nevertheless, I consider this embodiment also to be part of my invention.

Figure 9:
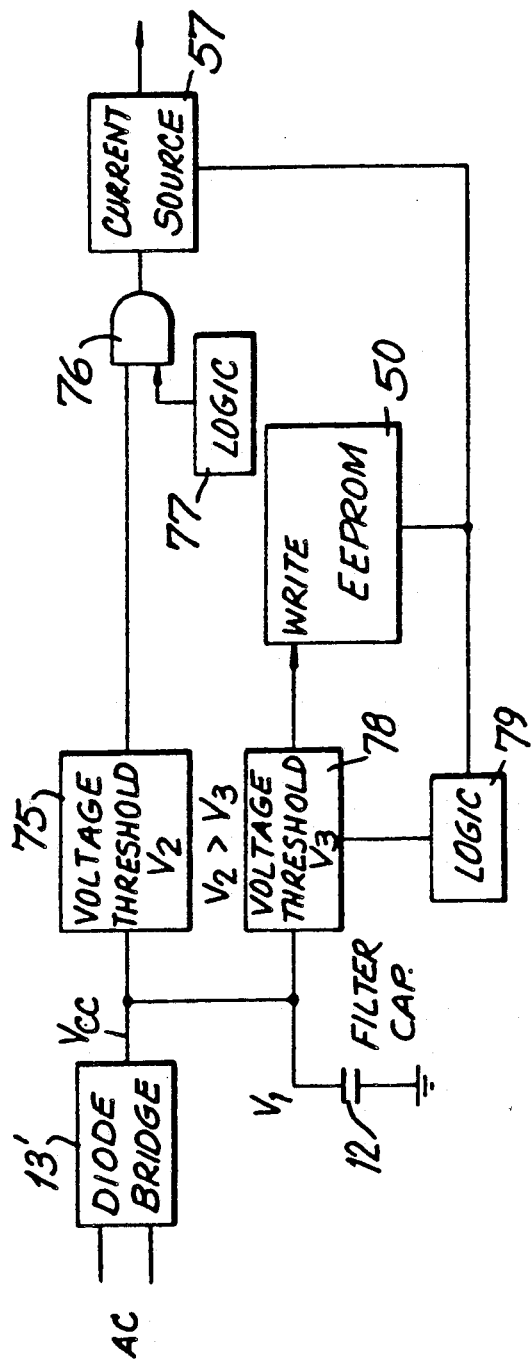
FIG. 9 is a block diagram of one form of two-threshold system in accordance with the invention.

FIG. 9 illustrates in block diagram an embodiment of the two-threshold system described above. In this embodiment, a first voltage level sensor 75 is triggered when the DC voltage, $V_{cc}$, falls to level $V_2$. This sends an enable signal to gate 76, to which a signal from a logic circuit 77 is also inputted. The logic circuit 77 can be used to avoid temporary glitches by only providing a "1" output after a certain specified period of time. When the combination of inputs to gate 76 enables the latter, the current source 57 for the LED is shut down. A second voltage level sensor 78 is triggered when $V_{cc}$ falls to $V_3$. This, too, can be provided with a suitable logic circuit 79 to protect against temporary glitches. If desired, logic circuit 79 can be coupled to the EEPROM 50 as well as to the current source 57 and provided with known circuitry so that if the stored state in the EEPROM is different from the ON or OFF condition of the current source, then, only, is a write signal enabled to write the current state of the system into the EEPROM. Or, as in the FIG. 5 embodiment, the EEPROM can be written to whether or not it is in the same or a different state from that of the system.

It will be evident that many changes in the circuits described can occur without departing from the inventive principles described herein. For example, some circuits, such as the bridge rectifier in the FIG. 4 embodiment, can be left off the chip. The triggering pulses and sequencing can obviously be obtained in other equivalent ways. So, for example, events can be triggered by the POR instead of the PORD pulse, or the EEPROM disabled against writing by means other than clamping $V_{pp}$ to $V_{cc}$. Timing intervals may be obtained by an internal monostable multivibrator instead of counting clock pulses from the line input. Also, instead of an EEPROM, other non-volatile storage means can be used, such as a small magnetic core memory. The block arrangement of FIG. 5 is more a result of the CMOS process used to implement the circuitry than of the underlying principles of the invention. If other technologies are used, likely the distribution of functions would be different, though the basic functions of state storage, level sensing, NVM enabling and disabling would be maintained. Other circuits to perform these functions will be apparent to those skilled in this art.

As will be evident from the foregoing description, an all solid-state control for the switching of AC power is achieved, which offers the major benefit of preserving the ON/OFF state of the device in the event of a power loss. This functionality is achieved with circuitry that is compact and can thus be fitted within a conventional electrical box, and that will possess an extremely long lifetime, due to the use of long life components not unnecessarily cycled or stressed. Being solid-state, the device can be operated at temperatures of up to 100° C., which is important because of the heat generated by the triac and the poorly ventilated environment for the device. No battery back-up is required. Isolation of the power circuit, at a high voltage, from the control circuit which may be operative at a low voltage is achieved in the preferred embodiment by means of the LED-photosensitive optoisolator coupling the control circuitry to the power circuit containing the triac. While the preferred embodiment uses a step-down transformer to derive the low voltages used to operate the semiconductor control circuitry, which is desirable, this is not necessarily essential if solid-state components operable at line voltage are available. Also, use of the LED optoisolator can be substituted by other isolating technologies well known in the art.

It is understood that the foregoing has shown and described particular embodiments of the invention, and that variations thereof will be obvious to one skilled in the art. Accordingly, the embodiments are to be taken as illustrative rather than limitative, and the true scope of the invention is as set out in the appended claims.

What is claimed is:

1. An AC power switching device comprising means for conveying AC power to a load under control of switching means, and solid-state circuit means for maintaining the state of the switching means upon reduction or unavailability of the AC power.

2. An AC power switching device as set forth in claim 1 wherein the switching means comprises at least one momentary switch and means for maintaining the state set by the momentary switch so long as AC power is available.

3. An AC power switching device as set forth in claim 2 wherein the means for maintaining comprises storing means including non-volatile memory operable upon reduction or unavailability of the AC power for storing the ON/OFF state of the momentary switch.

4. An AC power switching device as set forth in claim 2 wherein the means for maintaining further comprises means for comparing the state of the storing means and the state of the means for maintaining and for changing the state of the storing means only when the comparison shows they are not the same.

5. A control circuit for providing a drive signal to operate a controllable switch for applying power to a load, comprising:
a source of DC power to operate the control circuit, first means for sensing the voltage level outputted by the source, non-volatile memory means for storing the current ON-OFF condition of the controllable switch, a source of drive signals, and means connected to the sensing means and the means for storing and responsive to a falling voltage level outputted by the source to activate the means for storing to store the current condition of the controllable switch.

6. A control circuit as set forth in claim 5, wherein the means to activate includes means for first disabling the drive signal source before activating the means for storing.

7. A control circuit as set forth in claim 6, further comprising a flip-flop whose set or reset state determines the controllable switch ON-OFF state, and means connecting the non-volatile memory to the flip-flop for storing in the non-volatile memory the condition of the flip-flop and for using the state stored in the non-volatile memory to set or reset the flip-flop upon restoration of the voltage level to the level it was in before it began to fall.

8. A control circuit as set forth in claim 6, further comprising delay means to postpone storage in the non-volatile memory until after a predetermined time has elapsed after beginning of the falling voltage level outputted by the source.

9. A control circuit as set forth in claim 7, further comprising second means for sensing a voltage level when the falling voltage level outputted by the source reaches a value lower than that sensed by the first sensing means, the first sensing means functioning to shut down the drive signal source, the second sensing means functioning to activate the non-volatile memory.

10. A control circuit as set forth in claim 5, and further comprising means for preventing activation of the storing memory until a predetermined time interval has lapsed.

11. A control circuit as set forth in claim 7, wherein the control circuitry is fully incorporated in a single IC chip, and the non-volatile memory comprises at least one EEPROM element.

12. A control circuit as set forth in claim 11, wherein the non-volatile memory comprises two EEPROM elements.

13. A method for controlling the application of AC power to a load, comprising the steps:
(a) providing a controllable switch which when turned ON applies AC power to the load and when turned OFF interrupts application of the AC power applied to the load,
(b) providing a control circuit for the controllable switch, said control circuit having an ON switch for turning the controllable switch ON and an OFF switch for turning the controllable switch OFF,
(c) providing non-volatile memory means activated by the AC power for storing the state of the controllable switch while power is still available to activate same,
(d) sensing the reduction or unavailability o power to store the state of the controllable switch such that when AC power is restored the controllable switch assumes the same state it possessed just prior to the reduction or unavailability of AC power.

14. A method for controlling the application of AC power to a load as claimed in claim 13, wherein step (d) comprises the steps of:
- (e) sensing a reduction of DC voltage derived from the AC power,
- (f) determining the state of the controllable switch when the voltage reduction of step (e) is sensed,
- (g) in the storing means for storing of step (c) the state of the controllable switch determined in step (f).

15. A method for controlling the application of AC power to a load as claimed in claim 14, wherein the storing step of step (g) is carried out after first comparing the state of said storing means of element (c) to the state of the controllable switch determined during step (f).

16. A method for controlling the application of AC power to a load as claimed in claim 15, wherein the storing step of step (g) is carried only if the state of said storing means of element (c) is different from the state of said controllable switch as determined during step (f).

17. A method for controlling the application of AC power to a load as claimed in claim 13, wherein a FF is used to hold the state of the control circuits ON and OFF switches, and an EEPROM is set to the state of the FF, comprising the additional steps of:
- upon carrying out step (e) read the state of the EEPROM, if the read EEPROM state is the same as the state of the FF do nothing,
- if the read EEPROM state is different from that of the FF, change the state of the EEPROM,
- upon start-up following the restoration of voltage of the AC power, read the state of the EEPROM and set the state of the FF to the just-read state of the EEPROM, whereby upon start-up, the controllable switch assumes the same condition it had just before the reduction or unavailability of the AC power.

18. A method for controlling the application of AC power to a load using an optoisolator including an LED which when driven with source current connects the load to an AC line, comprising:
- (a) providing a control circuit operated by a DC voltage derived from the AC line,
- (b) providing in the control circuit a bistable circuit to store a set or reset condition which controls the current source for the LED,
- (c) continually sensing the DC voltage,
- (d) when the sensed DC voltage falls below a determined value, shutting down the LED current source and storing the state of the bistable circuit in non-volatile memory,
- (e) when the DC voltage level is restored, using the state stored in the non-volatile memory to set or reset the bistable circuit to the same state it was in before the DC voltage fall.

19. A method for controlling the application of AC power to a load as claimed in claim 18 wherein step (d) is not carried out until after a predetermined delay and the failure of the DC voltage to be restored to its original value.

20. A method for controlling the application of AC power to a load as claimed in claim 19, wherein step (d) is carried out in such manner that shutting down of the LED current source precedes by a predetermined time interval storage of the state.

21. A method for controlling the application of AC power to a load as claimed in claim 20, wherein the non-volatile memory comprises an EEPROM requiring a write voltage generated by a charge pump to store information, and the charge pump is not activated until the LED current source is shut down.

* * * * *